United States Patent [19]

Takei et al.

[11] Patent Number: 5,125,509
[45] Date of Patent: Jun. 30, 1992

[54] CONTAINER FOR PRECISION PARTS

[75] Inventors: Kazuhiro Takei; Yukio Yamada, both of Saitama; Kenichi Hanaoka, Tokyo; Toshitsugu Yajima, Itoigawa, all of Japan

[73] Assignee: Dai Nippon Insatsu K.K., Tokyo, Japan

[21] Appl. No.: 722,399

[22] Filed: Jun. 20, 1991

Related U.S. Application Data

[63] Continuation of Ser. No. 492,190, Mar. 13, 1990, abandoned.

[30] Foreign Application Priority Data

Mar. 15, 1989 [JP] Japan ................................ 1-29539[U]
Sep. 20, 1989 [JP] Japan ................................ 1-110088[U]

[51] Int. Cl.$^5$ ............................................. B65D 73/02
[52] U.S. Cl. .................................... 206/332; 206/334; 220/7
[58] Field of Search ............... 206/328, 329, 332, 334, 206/454; 220/6, 7

[56] References Cited

U.S. PATENT DOCUMENTS

| | | | |
|---|---|---|---|
| 2,868,406 | 1/1959 | Kookogey | 220/7 |
| 3,048,147 | 8/1962 | McKean | 220/6 X |
| 3,054,501 | 9/1962 | Maynard | 220/6 X |
| 3,675,808 | 7/1972 | Brink | 220/7 |
| 3,814,220 | 6/1974 | Brody | 220/6 X |
| 4,170,313 | 10/1979 | Caves et al. | 220/7 |
| 4,241,829 | 12/1980 | Hardy | 206/334 X |
| 4,266,670 | 5/1981 | Mykleby | 220/6 X |
| 4,498,598 | 2/1985 | Bae | 220/6 |
| 4,564,880 | 1/1986 | Christ et al. | 206/334 X |
| 4,609,104 | 9/1986 | Kasper et al. | 206/328 X |
| 4,681,221 | 7/1987 | Chickanosky et al. | 206/328 |
| 4,793,488 | 12/1988 | Mortensen | 206/334 X |
| 4,817,263 | 4/1989 | Donalson et al. | 206/334 X |
| 4,826,440 | 5/1989 | Plocek et al. | 206/328 X |

Primary Examiner—Paul T. Sewell
Assistant Examiner—Jacob K. Ackun, Jr.
Attorney, Agent, or Firm—Sughrue, Mion, Zinn, Macpeak & Seas

[57] ABSTRACT

A container of substantially rectangular cross section is formed of synthetic resin and comprises a container body and a lid member to be detachably mounted to the container body. The container body is provided with longitudinal and lateral side walls and a bottom wall and is capable of being molded as a single piece and thereafter foldable into a container. A locking device for locking the container body and the lid member is located on an outer surface of a side wall of the container body and on a corresponding inner surface of a side wall of the lid. The locking member comprises projections extending outwardly from outer surfaces of the lateral side walls of the container body and corresponding recesses extending inwardly from inner surfaces of the lateral side walls of the lid member. A pair of the longitudinal side walls of the lid member are provided with projected portions formed on upper edges thereof and with recessed portions formed on lower edges thereof, wherein each recessed portion formed so as to have an inner shape corresponding to an outer shape of each projected portion. Projecting pieces are formed on the inner surfaces of the lateral side walls of the container body for abutting against and supportably fixing the contents, which have an outer perimeter surface area smaller than a surface area of the bottom wall of the container body.

18 Claims, 5 Drawing Sheets

CONTAINER FOR PRECISION PARTS

This is a continuation of application Ser. No. 07/492,190 filed Mar. 13, 1990 now abandoned.

BACKGROUND OF THE INVENTION

The present invention relates to a container for precision parts and, more particularly, to a container for accommodating, in a laminated state, a plurality of precision electronic parts such as lead frames for attaching semiconductor tips.

Usually, some precision electronic parts such as lead frames have used wrapping paper to prevent their deformation and the wrapping paper is then firmly bonded at several portions, three portions, for example, in the longitudinal direction of the package. A plurality of the formed packages are packaged together with packings in a case and then delivered.

However, the package wrapped by a wrapping paper is easily deformed when a certain external force is applied during wrapping or delivery time thereof and, in an adverse case, the wrapped content may become unusable. Particularly, when the contents such as precision parts (e.g., lead frames), for example, each having relatively heavy weight and thin thickness is packaged. In which case it has been required to utilize a specific container or package for preventing the deformation thereof.

SUMMARY OF THE INVENTION

An object of the present invention is to substantially eliminate the defects encountered by the prior art described and to provide containers particularly for accommodating precision electronic parts such as lead frames without being deformed during the delivery thereof, and still remain easily washed after the usage of the container for the reuse thereof.

Another object of the present invention is to provide containers particularly for accommodating precision electronic parts capable of being stacked with each other with no positional shifting and of being easily washed after the usage for the reuse thereof.

Further object of the present invention is to provide containers particularly for accommodating precision electronic parts having structures for firmly fixing the parts in the container.

This and other objects can be achieved according to the present invention by providing a container comprising a container body and a lid member to be detachably mounted to the container body, characterized in that the container body is provided with foldable longitudinal and lateral side walls, and a bottom wall. The container body is also provided with an upper opening. The lid member is provided with longitudinal and lateral side walls and a top portion, and a locking means for locking the container body and the lid member is located on an outer surface of a side wall of the container body and on an inner surface of a side wall, corresponding to the side wall of the container body, of the lid member.

In preferred embodiments, the locking means comprises projections extending outwardly from outer surfaces of the lateral side walls of the container body and projections extending inwardly from inner surfaces of the lateral side walls of the lid member.

The container body and the lid member are formed of synthetic resin and the longitudinal and lateral side walls of the container body are integrally formed with the bottom wall through a connecting portion. The longitudinal side walls of the container body have end portions to which recesses are formed so as to engage with corresponding projections of the lateral side walls when the container body is assembled.

A pair of the longitudinal and/or a pair of the lateral side walls of the lid member are provided with projected portions formed on upper edges thereof and with recessed portions formed on lower edges thereof, each of the recessed portions being formed so as to have an inner shape corresponding to an outer shape of each of the projected portion so that a plurality of containers are easily and firmly stacked.

At least one projection is formed on an inner surface of each of the longitudinal side wall of the lid member.

The bottom wall of the container body is provided with a central portion of thin wall structure suitable for accommodating a content and the longitudinal side walls of the container body are provided with end portions of thin wall structure near corner portions of the container body.

Projecting pieces are formed on the inner surfaces of the lateral side walls of the container body for fixing a content having a surface area smaller than a surface area of the bottom wall of the container body. These projecting pieces are formed on the inner surface of the bottom wall of the container body for fixing both sides of a content having a surface area smaller than a surface area of the bottom wall of the container body.

According to the container of the structure described above, the container body and the lid member are formed of synthetic resin and the container body is capable of being developed, so that the container body can be easily washed and reused. The container body and the lid member are firmly locked by a simple locking means and reinforced. The projected portion and the recessed portion of the lid member make it possible to easily and firmly stack a plurality of containers. The bottom wall of the container body has an inner recessed portion having a shape suitably corresponding to a shape of a content to be accommodated. The top portion of the lid member is made thin so as to externally observe the detail of the content. Many attentions are paid for the structure of the container body and the lid member for easily and firmly accommodating the precision electronic parts such as lead frames. Further attention is paid for firmly fixing the content having a surface area smaller than a surface area of the bottom wall of the container body.

DESCRIPTION OF THE PREFERRED EMBODIMENT

A first embodiment according to the present invention will be described hereunder with reference to FIGS. 1 to 8.

Figure 1:
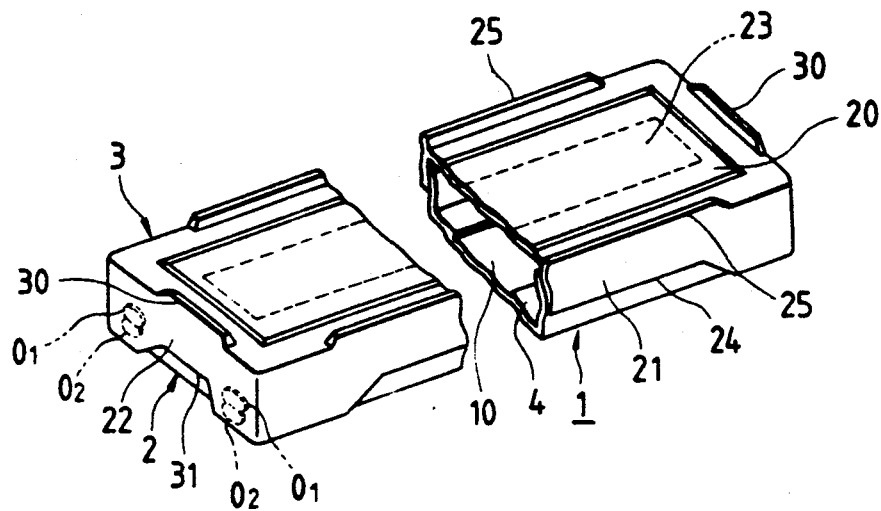
FIG. 1 is a perspective view, partially broken away, of a container of a first embodiment according to the present invention.

Referring to FIG. 1, a container 1 for accommodating precision parts according to the present invention comprises a container body 2 generally in box shape having an upper opening and a lid 3 mounted to the container body 2 so as to substantially enclose the same. The container 1 is made of a synthetic resin such as polypropylene, or any one of various kinds of polyethylene manufactured by low, intermediate or high pressure molding methods. The synthetic resin may also be an olefin series resin such as a copolymer of these materials, polyacetal, or ABS resin. In these materials, the polypropylene may be most desired for the reason that the polypropylene has the specific gravity of 0.9 which is relatively low and a transparent property suitable for the observation from the outside. In addition, the polypropylene has a property hardly causing wearing in contact with the content such as precision parts even in the conveyance thereof, thus hardly deforming the precision parts such as lead frames being of fine wires. Furthermore, the polypropylene has a relatively large rigidity which provides a superior impact-proof property, friction-proof property and heat-proof property, as well as in electrical characteristic, water-proof property and chemical-proof property. In order to prevent adhesion of dirt or the like, an antistatic substance or conductivity applying substance may be applied to the polypropylene.

Figure 2:
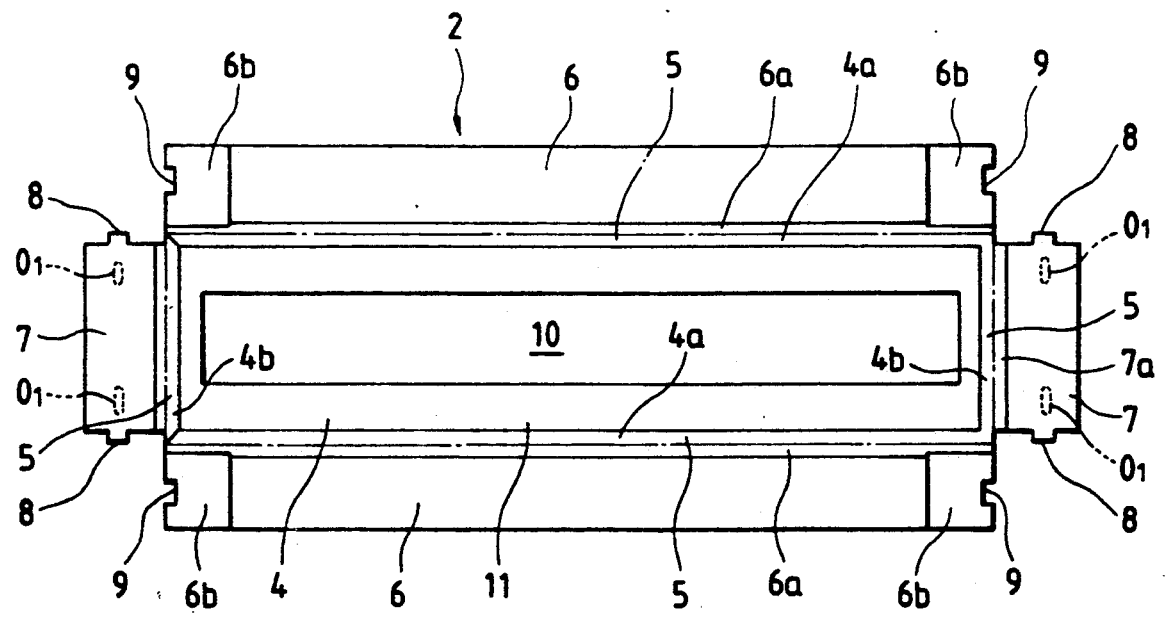
FIG. 2 is a developed view of a container body of the container shown in FIG. 1.

As shown in FIG. 2, the container body 2 can be developed and is provided with a rectangular bottom wall 4, longitudinal side walls 6 and 6 integrally formed with the bottom wall 4 through connecting portions 5 and 5, and lateral side walls 7 and 7 also integrally formed with the bottom wall 4 through connecting portions 5 and 5. A pair of assembling projections 8 and 8 are formed on both ends of each lateral side wall 7, and a pair of recesses 9 and 9 are formed on both ends of each longitudinal side wall 6 so that a corresponding pair of assembling projection 8 and recess 9 are engaged with each other when the longitudinal and lateral side walls 6 and 7 are folded, thus constituting a bottomed container body 2 with the side walls 6 and 7 having relatively low heights.

Figure 3:
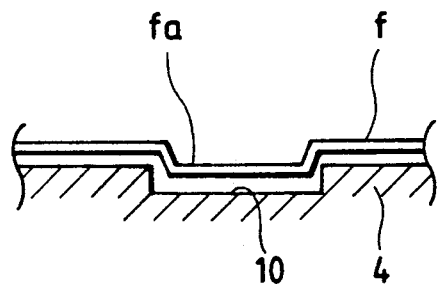
FIGS. 3 and 4 are partial views showing a container in which a content is accommodated.
Figure 4:
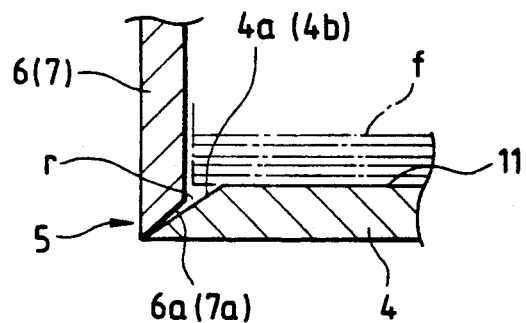

A rectangular recess 10 is formed to the inner surface of the bottom wall 4 at substantially the central portion thereof. The formation of a recess 10 is, as shown in FIG. 3, for accommodating a projection fa of a lead frame f, so-called a lead frame effected with an offset processing in which a portion to which a tip is attached projects. In such a case, it is desireable to dispose the projection fa so as not to contact the upper surface of the recess 10 such as shown in FIG. 3. Referring to FIG. 4, the connecting portions 5 and 5 for connecting the bottom wall 4 and the side walls 6 and 7 of the container body 2 are composed of inclining surface portions 4a and 4b surrounding the outer periphery of the bottom wall 4 and inclining surface portions 6a and 7a extending along respective one edges of the side walls 6 and 7. Each of the inclining surface portions 4a and 4b has a width longer than that of each of the inclining surfaces 6a and 7a. A recess r is formed between a supporting surface 11 of the bottom wall 4 for the lead frame f and the lower end portions of the side walls 6 and 7 so that the end edge of the lead frame f can be prevented from being nipped between both the inclining surface portions 4a (4b) and 6a (7a).

A plurality of projections $O_1$, $O_1$, —$O_1$, four in the illustration of FIG. 2, are formed on the outer side of the lateral side walls 7 for securing the engagement of the container body 2 with the lid 3 when engaged, the projection $O_1$ constituting one element for a locking mechanism.

Figure 5:
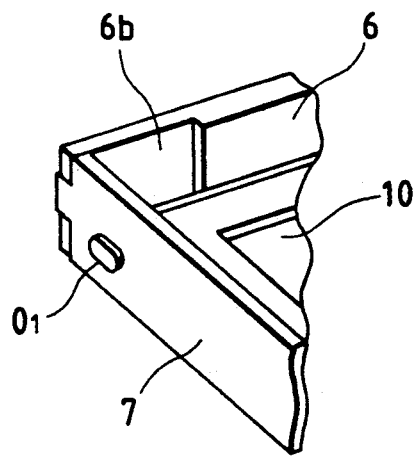
FIG. 5 is a perspective view showing one corner portion of the container body.

Further, as illustrated in FIG. 2 or 5, each longitudinal side wall 6 is provided with reduced wall portions 6b, 6b—6b formed by, cutting away a portion of the inner surface of the side wall 6 along predetermined lengths near the corners, i.e. end portions of the container body 2. The formation of these reduced wall portions keep the lead frame f from colliding against the side walls 6, thereafter becoming pressurized and, hence, being damaged during the delivery of the container 1 or during a time when the projections 8 of lateral side walls 7 are engaged with the recesses 9 of the longitudinal side walls 6.

Figure 6:
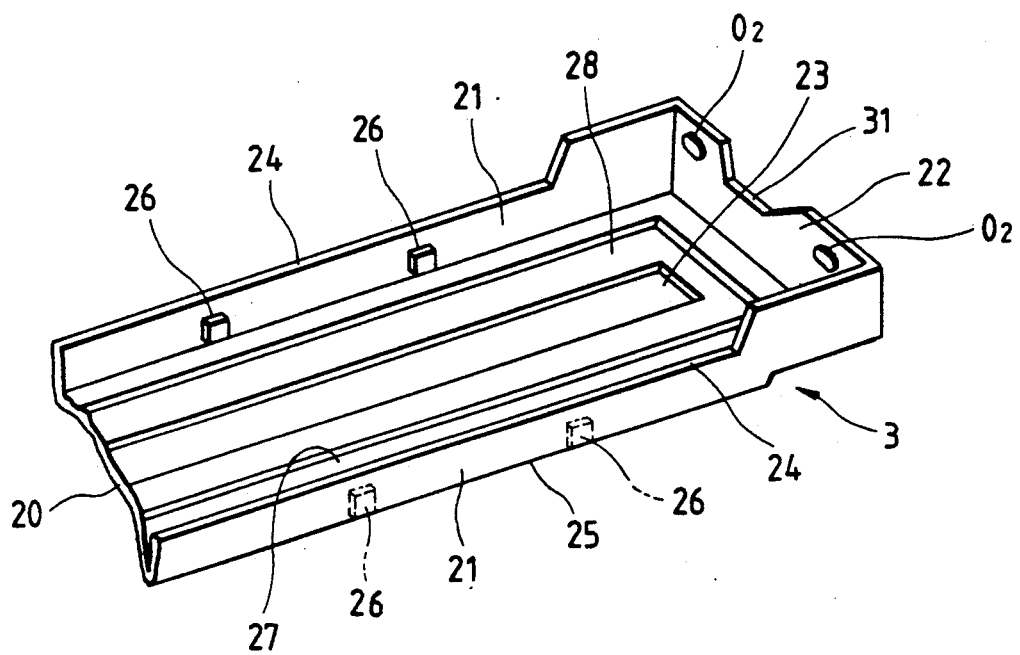
FIG. 6 is a perspective view of a lid, in a reversed state, for the container.
Figure 7:
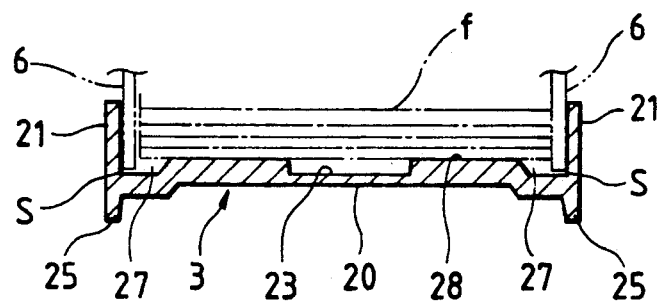
FIG. 7 is a cross section of the lid shown in FIG. 6.

The lid 3 is of box-like structure as shown in FIG. 6 in a reversed state and comprises a rectangular top plate 20, longitudinal side walls 21 and 21, and lateral side walls 22 and 22, both the walls 21 and 22 being formed integrally with the top plate 20 so as to surround the periphery thereof. The inner surface of the top plate 20 is recessed inwardly so as to form a recess 27 along the periphery thereof, whereby the end edge of the lead frame f can be prevented from being nipped in gaps formed between the upper ends of the side walls 6 and 7 of the container body 2 and the inner periphery of the top plate 20 of the lid 3 when the lid 3 is applied to the container body 2. The inner surface of substantially the central portion of the top plate 20 is formed as a rectangular reduced wall portion 23 to increase the transparent property of the lid 3 for facilitating easy external observation of the details of the content such as lead frame contained in the container 1. In the meantime, the relatively thick portion 28 of the top plate 20 surrounding the reduced wall portion 27 serves to press support the lead frames from the upper side thereof when the lid 3 is applied to the container body 2.

Reinforcing and supporting projections 26 are formed on the inside surface of the longitudinal side walls 21 of the lid 3, two on one side wall 21 in the illustration of FIG. 6, to reinforce the side walls 21 and to prevent the side walls 6 of the container body 2 from widening outwardly. On the inner surface of the lateral side walls 22 of the lid 3 are formed projections $O_2$, $O_2$, —$O_2$, which constitute the locking mechanism when engaged with the projections $O_1$, $O_1$—$O_1$. Projections $O_1$ are formed on the outer surface of the lateral side walls 7 of the container body 2 in a state shown in FIG.

1 when the lid 3 is applied to the container body 2. According to the location of the locking mechanism, the lid 3 cannot be removed from the container body 2 when the lid 3 is grasped and raised. The lid 3 may be disengaged from the container body 2 only by raising the lateral side walls 22 of the lid 3 while inwardly deforming the central portions of the longitudinal side walls 21 of the lid 3 or by raising the lid 3 while inwardly deforming the lateral side walls 7 of the container body 2. Furthermore, when the container 1 is raised by grasping the central portions of the longitudinal side walls 21, both the longitudinal ends of the lid 3 are inwardly bent, so that the locking function will be further improved.

Figure 8:
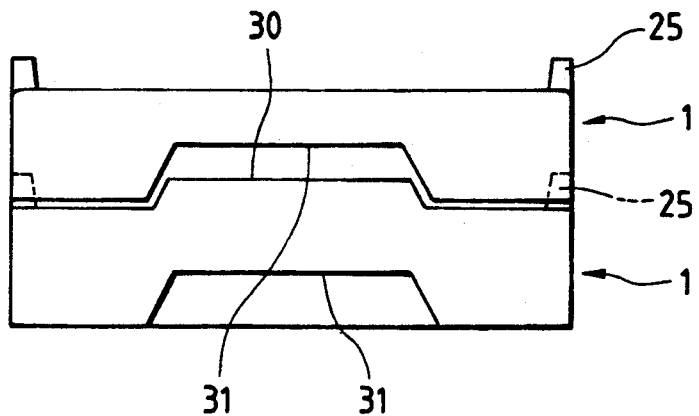
FIG. 8 is an illustration showing a stacked condition of the containers of the structure shown in FIG. 1.

Projected portions 25 and 30 of the longitudinal and lateral side walls 21 and 22 of the lid 3 and recessed portions 24 and 31 may be also formed on the lower edge portions of the longitudinal and lateral side walls 21 and 22 of the lid 3. Thus when a plurality of the containers 1 are stacked, the projected portions 25 and 30 of one container 1 can be engaged with the recessed portions 24 and 31 of another container stacked on that container, as shown in FIG. 8. Also, the recessed portions 24 and 31 of this one container 1 can be engaged with another container stacked below it, whereby undesired shifting of the containers in the stacked state can be effectively prevented even in the delivery thereof. The container of the structure described above will be utilized as follows.

When the content such as lead frame f is accommodated in the container body 2, a number of lead frames such as fifty frames in a laminated state are disposed on the bottom wall 4 of the container body 2 in the assembling state shown in FIG. 2. Both the side walls 6 and 7 are then folded so that the projections 8 and the recesses 9 are firmly engaged with each other to form a box-shaped container body 2 with an upper opening. Thereafter, the lid 3 which is formed integrally as a box-shaped lid 3 as shown in FIG. 6 is applied to the container body to close the open end of the container body 2. In this closing operation, when the lid 3 is pressed downwardly, the projections $O_1$ formed on the side wall 7 of the container body 2 are engaged with the projections $O_2$ formed on the side walls 22 of the lid 3, thus establishing the locking condition between the lid 3 and the container body 2. The thus locked containers 1 are stacked and further packaged in a large case and delivered.

When it is desired to take out the content, the lid 3 is separated from the container body 2 by pressing the central portions of the longitudinal side walls 21 inward and downward, while holding the recessed portions 24 of the side walls 21, and then raising the lid, or by inwardly pressing the lateral side walls 7 of the container body 2 to release the engagement between the projections $O_1$ and $O_2$, holding the recessed portions 24 and then raising the lid 3 upwardly. After the removal of the lid 3, the container body 2 is unfolded to the state shown in FIG. 2 and then the content is taken out.

Therefore, according to the container of the present invention, the content can be easily taken out of the container and the container can be again utilized after washing the container with etylalcohol, for example. This washing effect can be improved by the easily unfoldable structure of the container body.

Figure 10:
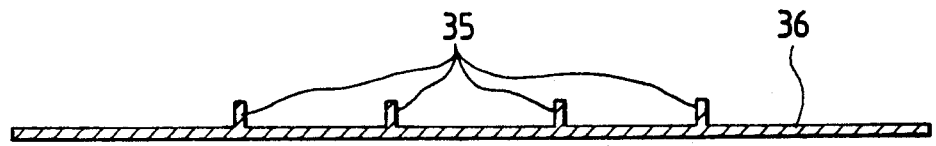
FIG. 10 is a sectional view taken a along the line x—x shown in FIG. 9.
Figure 11:
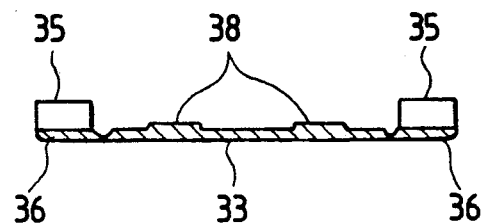
FIG. 11 is a sectional view taken along the line XI—XI shown in FIG. 9.

A second embodiment of the present invention will be described hereunder with reference to FIGS. 9 to 11.

Figure 9:
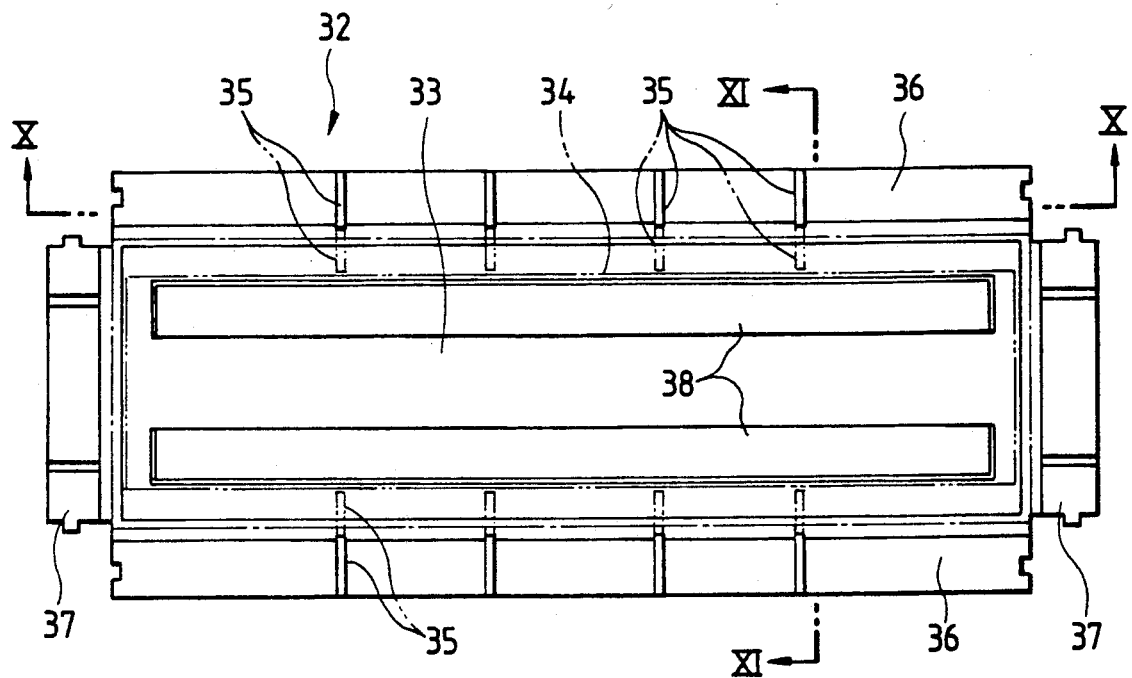
FIG. 9 is a developed view similar to that of FIG. 2 of a container body of a container of a second embodiment according to the present invention.

FIG. 9 is a developed view, similar to that of FIG. 2, of a container body 32, which is merely different in the structure in the following points from the container body 2 of the first embodiment. Referring to FIGS. 9 to 11, a plurality of projections 35 are formed on longitudinal side walls 36 of the container body 32 for securing a content 34, on a bottom wall 33 of the container body 32, having an area smaller than that of the bottom wall 33. Each of the securing projections 35 is of substantially rectangular shape and, as in the illustration, respective four projections 35 are arranged on the inner surfaces of the longitudinal side walls 36 of the container body 32 with equal spaces. These projections which are for the purpose of securing the contents in one position, may also be formed on the inner surfaces of the lateral side walls 37 of the container body 32 as occasion demands.

Protrusions 38, two in the illustration, each in the form of a line may be formed on the inner surface of the bottom wall 33 of the container body 32 for easy and firm settling of the contents.

When it is desired to accommodate the content in the container of the structure of the second embodiment, the content 34 such as lead frames are mounted on the bottom wall 33 now in the unfolded condition as shown in FIG. 9. The longitudinal and lateral side walls 36 and 37 are then folded so that both the end portions are engaged with each other to form a box-shaped container body as described with reference to the first embodiment. Thereafter, a lid substantially the same structure as that of the first embodiment is applied to the assembled container body 32 and then delivered. The lead frames 34 in the container body 32 can be firmly positioned by engagement with the front end edges of the securing projections 35, and with the inner surfaces of the side walls 37 of the container body 32. This prevents an undesired shifting or displacement of the content in the container body during the delivery thereof.

According to the second embodiment, only the projections 35 are formed independently from the other portions for securing the position of the contents within the container body 32, so that the other portions such as bottom wall 33 and side walls 36 and 37 can be formed commonly with respect to various contents to be accommodated and, accordingly, only the projections 35 need to be additionally formed in conformity with the shape of contents to be accommodated (i.e., layer projections for smaller contents). Accordingly, when various types of blanks of the container bodies are formed by means of an injection mold, it may be possible to utilize an injection mold to form the entire container, and only change the mold portion corresponding to the projections 35 to vary the projection size for the variously sized contents.

Figure 13:
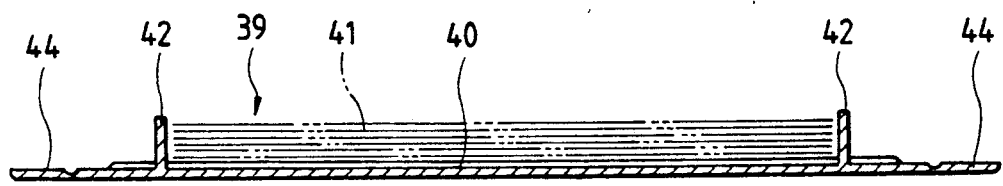
FIG. 13 is a sectional view taken along the line XIII—XIII shown in FIG. 12.
Figure 14:
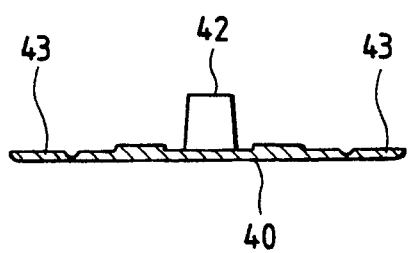
FIG. 14 is a sectional view taken along the line XIV—XIV shown in FIG. 12.

A third embodiment according to the present invention will be described hereunder with reference to FIGS. 12 to 14.

Figure 12:
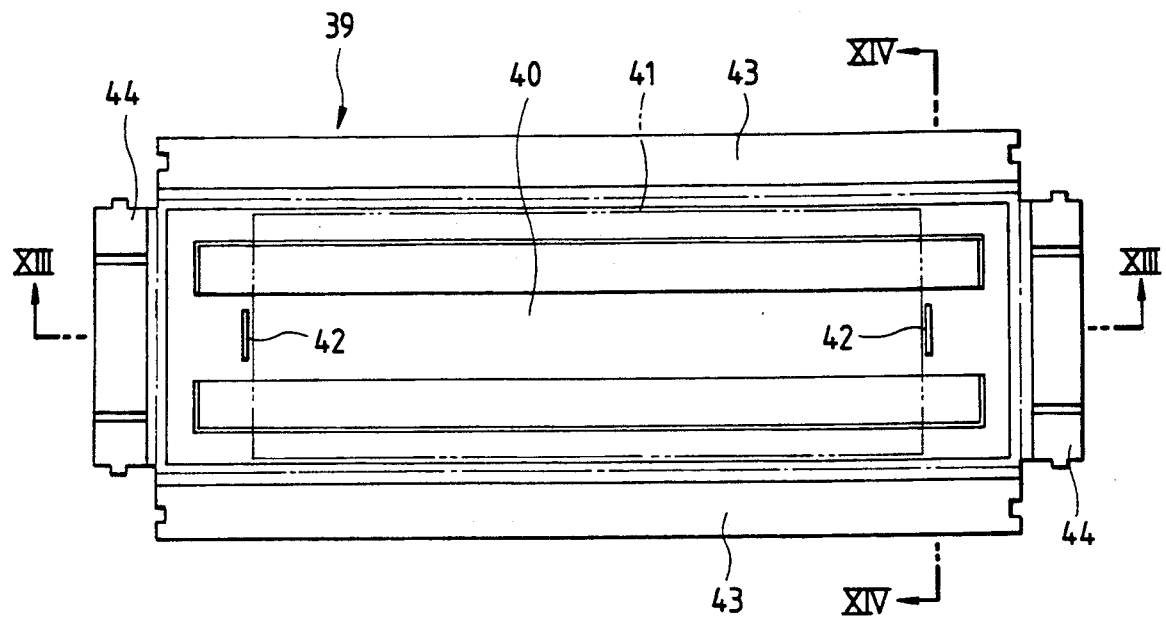
FIG. 12 is a developed view similar to that of FIG. 2 or FIG. 9 of a container body of a container of a third embodiment according to the present invention.

FIG. 12 is a developed view, similar to that of FIG. 2, of a container body 39, which is merely different in the structure in the following points from the container body 2 of the first embodiment. Referring to FIGS. 12 to 14, two projections 42 are formed on the bottom wall 40 of the container body 39 for securing a content 41 having a lower area smaller than the area of the bottom wall 40. According to this embodiment, a content 41 such as lead frames to be accommodated in the container body 39 can be firmly positioned and secured in the container body 39 by the engagement of the content 41 with the inner surfaces of the longitudinal walls 42 and the projections 42, thus preventing an undesired shifting or displacement of the content 41 in the container body 39 during the delivery thereof.

According to the third embodiment, only the projections 42 are formed independently from the other portions for container the position of the content 41 in the container body 39, so that the other portions such as bottom wall 40 and side walls 43 and 44 can be formed commonly with respect to various contents to be accommodated and only the projections 42 may be additionally formed in conformity with the shape of contents to be accommodated. Accordingly, when various types of container bodies are formed by means of an injection mold, it may be possible to utilize a single injection mold and only change a portion of the mold corresponding to the projections 42 determined by the intended contents. Alternatively, projections such as projections 42 may be formed on the side walls 43 and 44 as needed.

As disclosed, it should be understood by persons in the skilled art that the present invention is not limited to the described preferred embodiments and many other modifications and changes may be made without departing from the scopes of the appended claims.

What is claimed is:

1. A container for accommodating a precision electronic part comprising:

a container body formed of a synthetic resin and provided with first longitudinal and first lateral side walls and a bottom wall for mounting the precision electronic part so as first to form an upper opening when assembled, said first longitudinal and first lateral side walls being integrally formed with said bottom wall through connection portions and being foldable to facilitate assembly, said first lateral and longitudinal side walls having end portions with assembling projections and recesses formed thereon, which enable the container to be self-supporting when said assembling projections and recesses are frictionally engaged with one another;

a lid member to be detachably mounted to the container body and formed of a synthetic resin and provided with second longitudinal and second lateral side walls integrally formed with a top portion such that said second longitudinal and lateral side walls supportably overlap said first longitudinal and lateral side walls, wherein at least one of a pair of said second longitudinal and a pair of said second lateral side walls of said lid member are provided with projected portions formed on upper edges thereof, and with recessed portions formed on lower edges thereof, each of said recessed portions being formed to have an inner shape corresponding to an outer shape of each of said projected portions; and first and second locking projections for locking said container body and said lid member when assembled, wherein at least one first locking projection is located on and outwardly extending from an outer surface of each of the first lateral side walls and at least one second locking projection is located on and inwardly extending from a corresponding inner surface of each of said second lateral side walls.

2. A container according to claim 1, wherein at least one reinforcing projection is formed on an inner surface of each of said second longitudinal side walls of said lid member.

3. A container according to claim 1, wherein said bottom wall of said container body is provided with a central portion of thin wall structure suitable for accommodating the precision electronic part.

4. A container according to claim 1, wherein said first longitudinal side walls of said container body have thinner walls near end portions thereof, and thicker walls away from said end portions.

5. A container according to claim 1, wherein said synthetic resin is of a transparent type.

6. A container according to claim 5, wherein the top portion of said lid member has a portion of thinner wall structure than a remainder of said top portion.

7. A container according to claim 1, wherein said top portion of said lid member is provided with a peripheral portion of inwardly recessed structure.

8. A container according to claim 1, wherein projecting pieces are formed on the inner surfaces of said first lateral side walls of said container body for supportably fixing the precision electronic part, wherein said precision electronic part has a surface area smaller than a surface area of said bottom wall of said container body.

9. A container according to claim 1, wherein projecting pieces are formed in the inner surface of said bottom wall of said container body for supportably fixing both sides of the precision electronic part, wherein said precision electronic part has a surface area smaller than a surface area of said bottom wall of said container body.

10. A container for accommodating a precision electronic part comprising:

a container body formed of a synthetic resin and provided with first longitudinal and first lateral side walls and a bottom wall for mounting the precision electronic part so as first to form an upper opening when assembled, said first longitudinal and first lateral side walls being integrally formed with said bottom wall through connection portions and being foldable to facilitate assembly, said first lateral and longitudinal side walls having end portions with assembling projections and recesses formed thereon, which enable the container to be self-supporting when said assembling projections and recesses are frictionally engaged with one another;

a lid member to be detachably mounted to the container body and formed of a synthetic resin and provided with second longitudinal and second lateral side walls integrally formed with a top portion such that said second longitudinal and lateral side walls supportably overlap said first longitudinal and lateral side walls; and first and second locking projections for locking said container body and said lid member when assembled, wherein at least one first locking projection is located on and outwardly extending from an outer surface of each of the first lateral side walls and at least one second locking projection is located on and inwardly extending from a corresponding inner surface of each of said second lateral side walls wherein connecting portions, for connecting the bottom wall and the first longitudinal and lateral side walls of the container body, are composed of inclined surface portions which surround the outer periphery of the bottom wall, and inclined surface portions extending along one edge of each of said first longitudinal and lateral side walls, wherein each of said inclined surface portions surrounding the outer periphery of the bottom wall has a width longer than a width of said inclined surface portions extending along one edge of said first longitudinal and lateral side walls.

11. A container according to claim 10, wherein at least one projection is formed on an inner surface of each of said longitudinal side walls of said lid member.

12. A container according to claim 10, wherein said bottom wall of said container body is provided with a central portion of thin wall structure suitable for accommodating the precision electronic part.

13. A container according to claim 10, wherein said first longitudinal side walls of said container body have thinner walls near end portions thereof, and thicker walls away from said end portions.

14. A container according to claim 10, wherein said synthetic resin is of a transparent type.

15. A container according to claim 14, wherein the top portion of said lid member has a portion of thin wall structure.

16. A container according to claim 10, wherein said top portion of said lid member is provided with a peripheral portion of inwardly recessed structure.

17. A container according to claim 10, wherein projecting pieces are formed on the inner surfaces of said first lateral side walls of said container body for supportably fixing the precision electronic part, wherein said precision electronic part has a surface area smaller than a surface area of said bottom wall of said container body.

18. A container according to claim 10, wherein projecting pieces are formed in the inner surface of said bottom wall of said container body for supportably fixing both sides of the precision electronic part, wherein said precision electronic part has a surface area smaller than a surface area of said bottom wall of said container body.

* * * * *